United States Patent
Kojima et al.

Patent Number: 5,287,072
Date of Patent: Feb. 15, 1994

[54] SEMICONDUCTOR DEVICE FOR IMPROVING HIGH-FREQUENCY CHARACTERISTICS AND AVOIDING CHIP CRACKING

[75] Inventors: Masakazu Kojima; Yoshio Aoki, both of Kawasaki; Seigo Sano, Yamanashi, all of Japan

[73] Assignees: Fujitsu Limited, Kawasaki; Fujitsu Yamanashi Electronics Limited, Yamanashi, both of Japan

[21] Appl. No.: 817,073

[22] Filed: Jan. 6, 1992

[30] Foreign Application Priority Data

Jan. 10, 1991 [JP] Japan ................ 3-001651

[51] Int. Cl.⁵ ........................................ H03F 3/60
[52] U.S. Cl. ................................ 330/307; 257/275
[58] Field of Search ........................ 330/307, 286; 307/303.2, 303; 357/22 E, 23.2, 23.14, 22 H, 22 I; 257/409, 275

[56] References Cited

U.S. PATENT DOCUMENTS

| | | | |
|---|---|---|---|
| 3,586,930 | 6/1971 | Behari Das et al. | 357/23.14 |
| 3,969,745 | 7/1976 | Blocker, III | 357/22 |
| 4,343,015 | 8/1982 | Baliga et al. | 357/22 E |
| 4,725,747 | 2/1988 | Stein et al. | 307/303.2 |
| 5,025,296 | 6/1991 | Fullerton et al. | 257/409 |

FOREIGN PATENT DOCUMENTS

| | | |
|---|---|---|
| 0015072 | 9/1980 | European Pat. Off. . |
| 0292641 | 11/1988 | European Pat. Off. ........ 330/307 |
| 0455483 | 11/1991 | European Pat. Off. . |
| 2369689 | 5/1978 | France . |

OTHER PUBLICATIONS

Patent Abstracts of Japan, vol. 14, No. 1687 (E-912) Mar. 30, 1990 & JP-A-2 026033 (NEC Corp.) Jan. 29, 1990.

Primary Examiner—Robert J. Pascal
Assistant Examiner—Tan Dinh
Attorney, Agent, or Firm—Staas & Halsey

[57] ABSTRACT

A semiconductor device comprises a plurality of gate electrodes, drain electrodes, and source electrodes axisymmetrically formed on opposite sides of a gate pad and drain pad. Two source pads are arranged at ends of these electrodes, to which the source electrodes are connected, so that a gate width can be shortened. Therefore, an output power, gain, etc., can be increased, and the high-frequency characteristics can be improved. Further, when arranging a plurality of semiconductor devices in parallel, the semiconductor chip can be formed in the shape of a square, i.e., the aspect ratio thereof can be reduced, and therefore, cracks in the semiconductor chip (semiconductor device) can be avoided.

12 Claims, 8 Drawing Sheets

SEMICONDUCTOR DEVICE FOR IMPROVING HIGH-FREQUENCY CHARACTERISTICS AND AVOIDING CHIP CRACKING

BACKGROUND OF THE INVENTION

1. Field of the Invention

The present invention relates to a semiconductor device, and more particularly, to a semiconductor device having a plurality of high-output power semiconductor transistors.

2. Description of the Related Art

Recently, digital communication systems such as mobile communication systems using satellite and quadrature amplitude modulation (QAM) communication networks have been rapidly, developing; these communication systems require high-power microwave semiconductor devices constituted by arranging a plurality of high-frequency high-output power transistors. Accordingly to meet this requirement, for example, metal semiconductor field effect transistors (MESFETs), metal insulator semiconductor field effect transistors (MISFETs), and high electron mobility transistors (HEMTs) have been studied and developed.

In a high-power microwave amplifier using the above semiconductor devices, which are used, for example, to amplify signals of the microwave band (1 GHz to 20 GHz) for transfer to a communication satellite, the semiconductor device (semiconductor chip) is positioned between an input matching circuit and an output matching circuit, and these input and output matching circuits are used for impedance matching at the input and output sides of the semiconductor chip (semiconductor device). Further, the input side electrodes of the semiconductor chip are connected to electrodes of the input matching circuit by bonding wires, and the output side electrodes of the semiconductor chip are connected to electrodes of the output matching circuit by bonding wires. When producing (assembling) the microwave amplifier, the semiconductor chip is directly disposed at a position between the input matching circuit and the output matching circuit in a package, and the semiconductor chip is then fixed to the surface of the package by heating and melting a gold-tin alloy and by carrying out a scrub process, i.e., a process of scrubbing the semiconductor chip on the surface of the package.

Note, the semiconductor chip (semiconductor device) is made thin, e.g., 30 $\mu$m or 100 $\mu$m, to effectively radiate the heat self-produced by the chip, because a high-power microwave semiconductor chip produces a large amount of heat. Further, the semiconductor chip for a high-power microwave semiconductor device is made, for example, of a compound semiconductor material (Gallium Arsenide: GaAs, and the like), which is more delicate than a silicon (Si) semiconductor chip, and thus may be broken during the scrub process and the like.

Recently, semiconductor devices comprising a plurality of source electrodes, drain electrodes, and gate electrodes have been studied and developed. For example, in such a semiconductor device, the source electrodes and the drain electrodes are formed into an interdigital shape (comb-like shape), the source and drain electrodes are alternated and spaced apart from one another, and the gate electrodes are formed in a comb like manner between the source electrodes and drain electrodes.

In this semiconductor device, when the output power of the semiconductor device must be increased, the unit gate width must be widened, or a total length of the gate widths must be made larger. Accordingly, to enlarge the total gate width, the semiconductor device (semiconductor chip) is comprised of a plurality of transistor cells (semiconductor devices) arranged in parallel.

Note, when the unit gate width is widened, to thereby realize a high-frequency high-output power semiconductor device, electric power supplied to ends of the source electrodes and drain electrodes is not uniformly transmitted to the other ends of the electrodes due to the gate width, and further, an uneven phase rotation may occur, and, the output power of the semiconductor device may be lowered. Furthermore, when the number of transistor cells is increased and the cells are arranged in parallel, the shape of the semiconductor chip (semiconductor device) is a rectangle having one side much longer than the other. Namely, the semiconductor device must be made long and thin, and thus the semiconductor device may be broken during the scrub process and the like. These problems of the prior art will be explained hereafter in detail.

SUMMARY OF THE INVENTION

An object of the present invention is to provide a semiconductor device by which the high-frequency characteristics thereof are improved and in which chip cracking, easily caused in prior art devices, is overcome.

According to the present invention, there is provided a semiconductor device for amplifying signals comprising: a semiconductor layer; a first conductivity pad formed on the semiconductor layer; a plurality of first electrodes extending from the first conductivity pad in a plurality of different directions and forming a comb-shape; a plurality of second conductivity pads formed on the semiconductor layer adjacent to open ends of the first electrodes; a plurality of second electrodes extending from the second conductivity pads and forming a comb-shape, and alternating with the first electrodes at specific intervals; a third conductivity pad formed in an inner region of the first conductivity pad, and electrically isolated from the first conductivity pad; and a plurality of third electrodes connected to the third conductivity pad, and formed on the semiconductor layer between the first electrodes and the second electrodes.

The first electrodes may extend in two opposite directions from the first conductivity pad, and two of the second conductivity pads may be provided. A plurality of the semiconductor devices may be arranged in parallel, to constitute a semiconductor chip. Further, the semiconductor device may be formed in the shape of a square.

The first electrodes may extend in three directions from the first conductivity pad, and three of the second conductivity pads are provided. The first electrodes may also extend in four directions from the first conductivity pad, and four of the second conductivity pads may be provided. A plurality of the semiconductor devices may be arranged to constitute a semiconductor chip having the shape of a square.

The semiconductor device may include a plurality of transistors, of which the first electrodes are drain electrodes, the second electrodes are source electrodes, and the third electrodes are gate electrodes of the transistors. The semiconductor device may amplify signals of microwave band.

Further, according to the present invention, there is also provided a microwave amplifier including a semiconductor device for amplifying signals, an input matching circuit, connected to the semiconductor device, for carrying out impedance matching at an input side of the semiconductor device; and an output matching circuit, connected to the semiconductor device, for carrying out impedance matching at the output side of the semiconductor device, wherein the semiconductor device comprises: a semiconductor layer; a first conductivity pad formed on the semiconductor layer; a plurality of first electrodes extending from the first conductivity pad in a plurality of different directions and forming a comb-shape; a plurality of second conductivity pads formed on the semiconductor layer adjacent to open ends of the first electrodes; a plurality of second electrodes extending from the second conductivity pads and forming a comb-shape, and alternating with the first electrodes at specific intervals; a third conductivity pad formed in an inner region of the first conductivity pad, and electrically isolated from the first conductivity pad; and a plurality of third electrodes connected to the third conductivity pad, and formed on the semiconductor layer between the first electrodes and the second electrodes.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

For a better understanding of the preferred embodiments, the problems of the prior art will be explained with reference to FIGS. 1 to 3.

Figure 1:
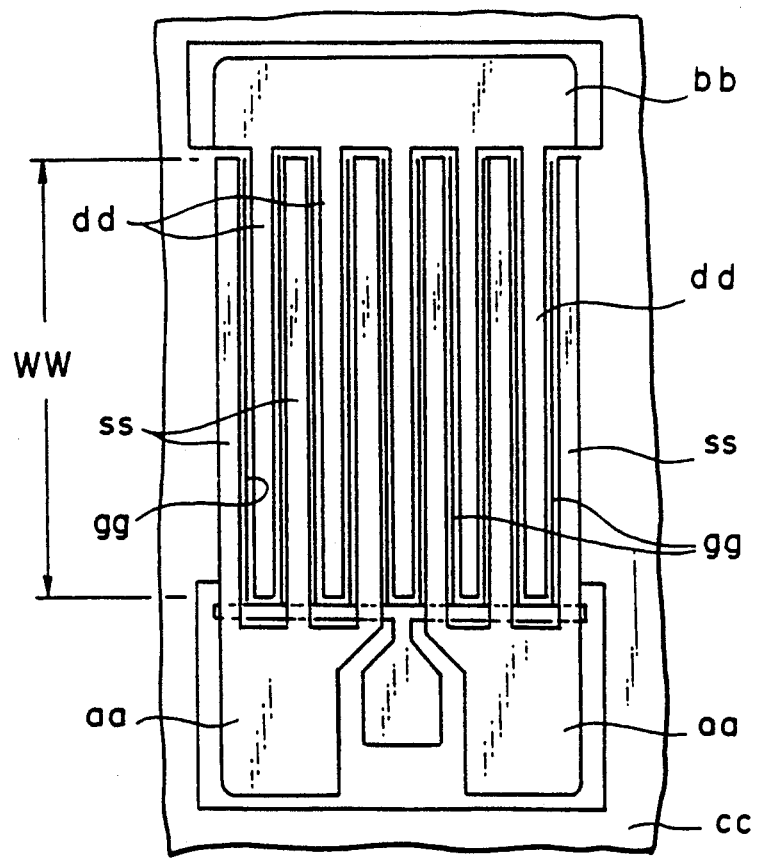
FIG. 1 is a plan view showing an example of a semiconductor device according to the prior art.

FIG. 1 shows an example of a semiconductor device according to the prior art, more particularly, FIG. 1 shows an example of the structure of a high-output MESFET of the prior art.

As shown in FIG. 1, the semiconductor device (MESFET) comprises two pads aa and bb, a plurality of source electrodes ss, drain electrodes dd, and gate electrodes gg. The source electrodes ss are connected to respective ones of the pads aa, and the drain electrodes dd are connected to the pad bb, positioned at the opposite side of the device from that of the pad aa. Namely, as shown in FIG. 1, the source electrodes ss and the drain electrode dd are formed in the shape of a comb (interdigital shape), the source and drain electrodes ss, dd are alternated and spaced apart from one another on an n-GaAs substrate cc, and the source and drain electrodes ss, dd are connected with an n-GaAs substrate cc by an ohmic contact. Further, the gate electrodes gg are formed in the shape of a comb between the source electrodes ss and drain electrodes dd, and the gate electrodes gg are connected to the n-GaAs substrate cc by a Schottky contact.

Note, in the semiconductor device shown in FIG. 1, when the output power of the semiconductor device must be increased, the unit gate width WW must be widened. Namely, when increasing the output power of the semiconductor device, the total extent, or dimension of the gate widths (total gate width) must be increased.

Figure 2:
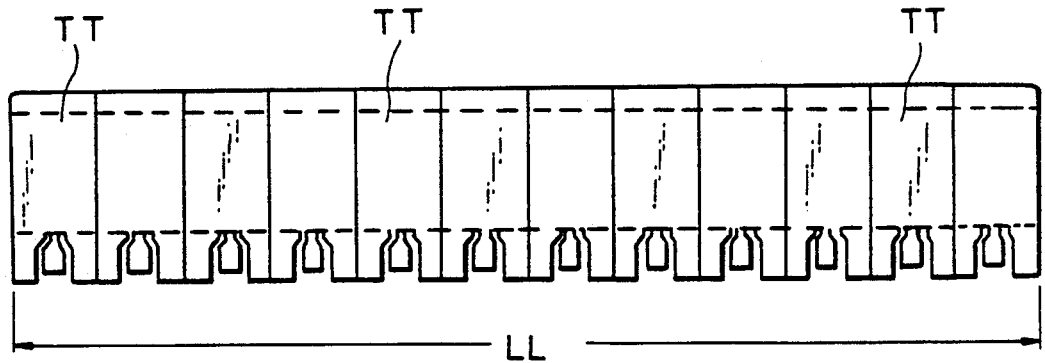
FIG. 2 is a plan view showing another example of a semiconductor device according to the prior art.

FIG. 2 shows another example of a semiconductor device according to the prior art.

As shown in FIG. 2, when arranging a plurality of transistor cells TT in parallel, the total gate width becomes large, and thus an output power of the semiconductor device becomes large. Note, each of the transistor cells TT corresponds to the semiconductor device shown in FIG. 1.

Note, when the number of the transistor cells TT is increased, or when the number of electrodes gg, ss, and dd is increased, the length of a gate bus line corresponding to the length LL of the semiconductor device (semiconductor chip) must be enlarged. Namely, when the number of the transistor cells TT is increased and the cells are arranged in parallel, the shape of the semiconductor chip (semiconductor device) is a rectangle having one side (LL) much longer than the other. Therefore, the semiconductor device must be made long and thin, and is made, for example, of a compound semiconductor material (GaAs, and the like), and thus the semiconductor device may be broken during the scrub process and the like. Further, the high-frequency characteristics of the semiconductor device (transistor) may deteriorated by an uneven phase rotation.

Figure 3:
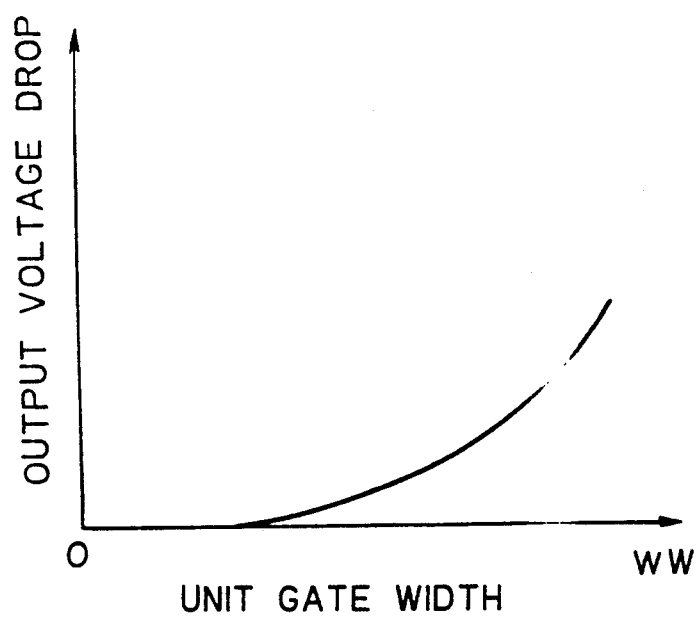
FIG. 3 is a characteristic view showing a relationship between a unit gate width and an output voltage drop.

FIG. 3 is a characteristic view showing a relationship between a unit gate width and an output voltage drop.

As shown in FIG. 3, the output voltage drop of the semiconductor device is lowered in accordance with the enlarging, i.e., increase, of the unit gate width WW, or the enlarging, i.e., increase, of the total gate width of the semiconductor device.

Namely, when the unit gate width WW is widened, to thereby realize a high-frequency, high-output power semiconductor device, electric power supplied to the ends of the source electrodes ss and drain electrodes dd is not uniformly transmitted to the other ends of the electrodes, due to the gate width WW. Further, an uneven phase rotation may occur, and the output power of the semiconductor device may be lowered.

Preferred embodiments of a semiconductor device according to the present invention will be now explained, with reference to the accompanying drawings.

Figure 4:
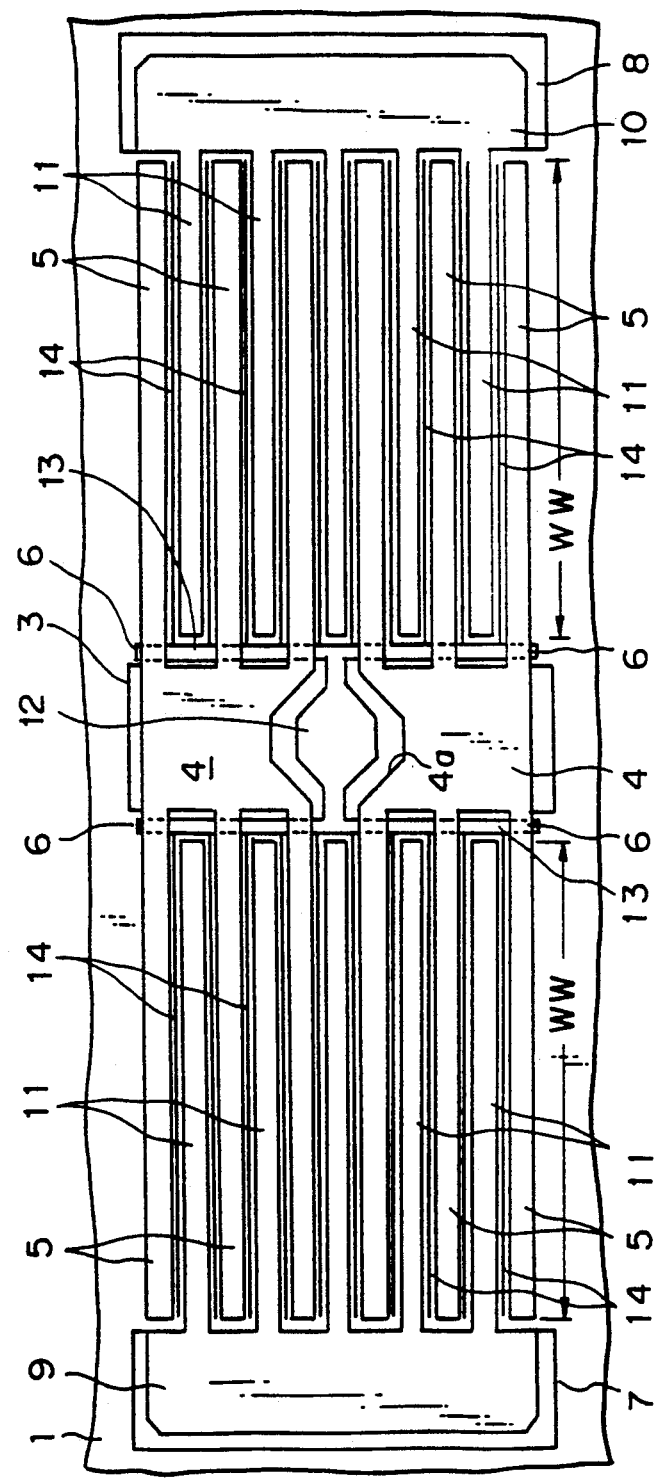
FIG. 4 is a plan view showing a first embodiment of a semiconductor device according to the present invention.
Figure 5A:
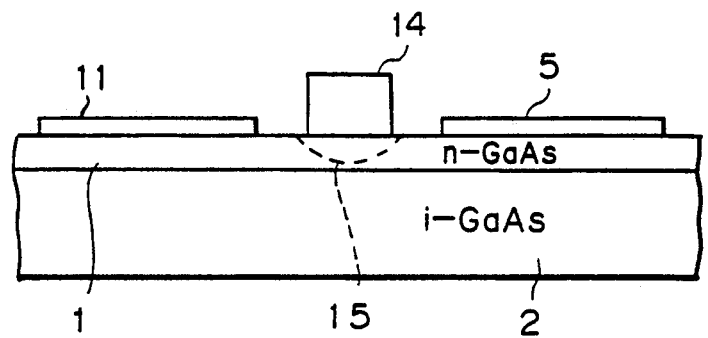
FIGS. 5A to 5C are partial enlarged sectional views showing examples of the semiconductor device shown in FIG. 4.
Figure 5B:
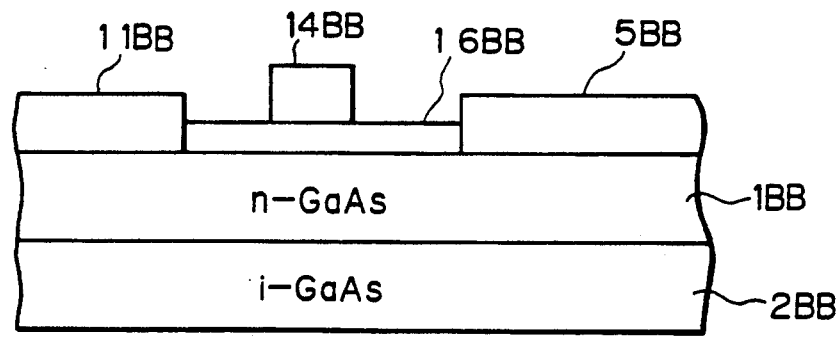
Figure 5C:
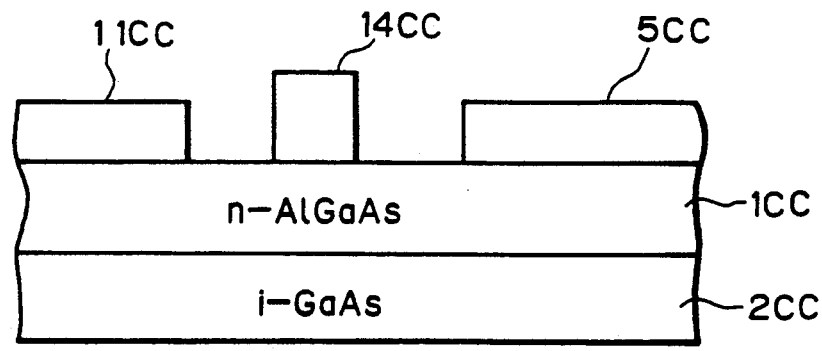
Figure 6:
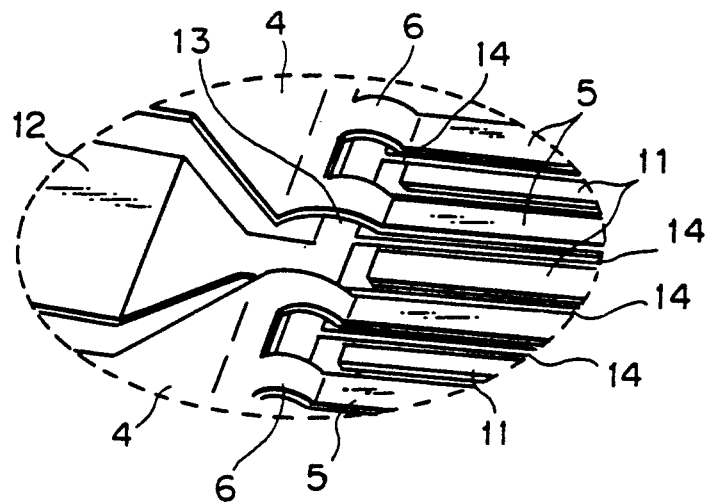
FIG. 6 is a partial enlarged perspective view showing the semiconductor device shown in FIG. 4.

FIG. 4 shows a first embodiment of a semiconductor device according to the present invention, FIGS. 5A to 5C are partial enlarged sectional views showing examples of the semiconductor device shown in FIG. 4, and FIG. 6 is an enlarged, perspective view of a segment of the semiconductor device shown in FIG. 4.

In FIG. 4, reference numeral 1 denotes an n-GaAs (n-type Gallium Arsenide) layer formed on an i-GaAs (intrinsic Gallium Arsenide) substrate 2; an insulation film 3, on which a conductivity drain pad 4 is formed, is formed on the n-GaAs layer 1. A plurality of drain electrodes 5 are formed at regular intervals on each side of the pad 4, in the shape of comb (interdigital shape), and are in ohmic contact with the n-GaAs layer 1.

As shown in FIG. 6, a part of each drain, electrode 5 close to the drain pad 4 is lifted from (i.e., raised relatively to) the n-GaAs layer 1 to form a parabolic air bridge 6.

As shown in FIG. 4, insulation films 7 and 8 are formed on the n-GaAs layer 1 adjacent to the respective ends of the oppositely oriented drain electrodes 5, and first and second conductivity source pads 9 and 10 are formed on the insulation films 7 and 8, respectively. The edges of the source pads 9, 10 are connected to source electrodes 11 disposed at regular intervals along and intermediate respective drain electrodes 5. The source electrodes 11 are in ohmic contact with the n-GaAs layer 1.

Further, reference numeral 12 denotes a conductivity gate pad arranged on the insulation film 3, on a portion thereof exposed through an opening 4a of the drain pad 4. Opposite sides of the gate pad 12 are connected to gate lead electrodes 13, respectively, arranged below the air bridges 6, and each of the gate lead electrodes 13 is connected to a plurality of gate electrodes 14 in Schottky contact with the n-GaAs layer 1. The gate electrodes 14 are arranged between and spaced apart from the source electrodes 11 and drain electrodes 5.

As shown in FIG. 4, a width WW of the gate electrodes 14 is set such that an output voltage drop due to an uneven phase rotation is minimized when a high-frequency signal voltage is applied to the gate electrodes 14. Namely, by comparing the semiconductor device shown in FIG. 4 with that shown in FIG. 1, the length of the unit gate width WW of the semiconductor device of FIG. 4 can be made to be only one half of that of FIG. 1, when the total length of the gate widths (i.e.,the total gate width) of each of the semiconductor devices of FIGS. 1 and 4 is made equal. Therefore, the high-frequency characteristics of the semiconductor device can be improved, and chip cracking in the semiconductor device is not easily caused.

FIGS. 5A to 5C show a metal semiconductor field effect transistor (MESFET), a metal insulator semiconductor field effect transistors (MISFET), and a high electron mobility transistors (HEMT), respectively.

As shown in FIG. 5A, in the MESFET, the gate electrode 14 is directly formed on the n-GaAs layer 1, and further, reference numeral 15 denotes a depletion layer to be produced in the n-GaAs layer 1 when a voltage is applied to the gate electrode 14.

As shown in FIGS. 5B to 5C, in the MISFET and HEMT, references 1BB and 1CC denote n-GaAs layers corresponding to the layer 1 shown in FIG. 5A, 2BB and 2CC denote i-GaAs substrates corresponding to the substrate 1 of FIG. 5A, 5BB and 5CC denote drain electrodes corresponding to the drain electrode 11 of FIG. 5A, 11BB and 11CC denote source electrodes corresponding to the source electrode 11 of FIG. 5A, and 14BB and 14CC denote gate electrodes corresponding to the gate electrode 14 of FIG. 5A. Note, as shown in FIG. 5B, in the MISFET, an insulation layer 16BB is provided between the gate electrode 14BB and the n-GaAs layer 1BB. Further, as shown in FIG. 5C, in the MISFET, the gate electrode 14CC is directly formed on the n-GaAs layer 1CC.

Next, the operation of this embodiment will be explained.

The gate electrodes 14 (14BB, 14CC), drain electrodes 5 (5BB, 5CC), and source electrodes 11 (11BB, 11CC) are axi-symmetrically formed on opposite sides of the gate pad 12 and drain pad 4, the two source pads 9 and 10 are arranged at the ends of these electrodes, and the source electrodes 11 are connected to the pads 9 and 10.

Since the gate width WW is set to prevent a voltage drop due to an uneven phase rotation, the electric power is uniformly delivered to all of the source electrodes 11 and drain electrodes 5, to thereby prevent a drop in the output voltage.

Further, the drain electrodes 5, etc., are formed as symmetrical groups on respective opposite sides of the pads 4 and 12, and thereby, the number of gate electrodes 14, drain electrodes 5, and source electrodes 11 is greater than the number of electrodes of the prior art semiconductor device (with reference to FIG. 1) having the electrodes formed on only one side of a pad. Therefore, in the semiconductor device of the present embodiment, the currents flowing in the electrodes 14, 5, and 11 can be increased.

Consequently, according to the semiconductor device of the present embodiment, the influence of uneven phase rotation in the transistor (semiconductor device) can be reduced.

Figure 7:
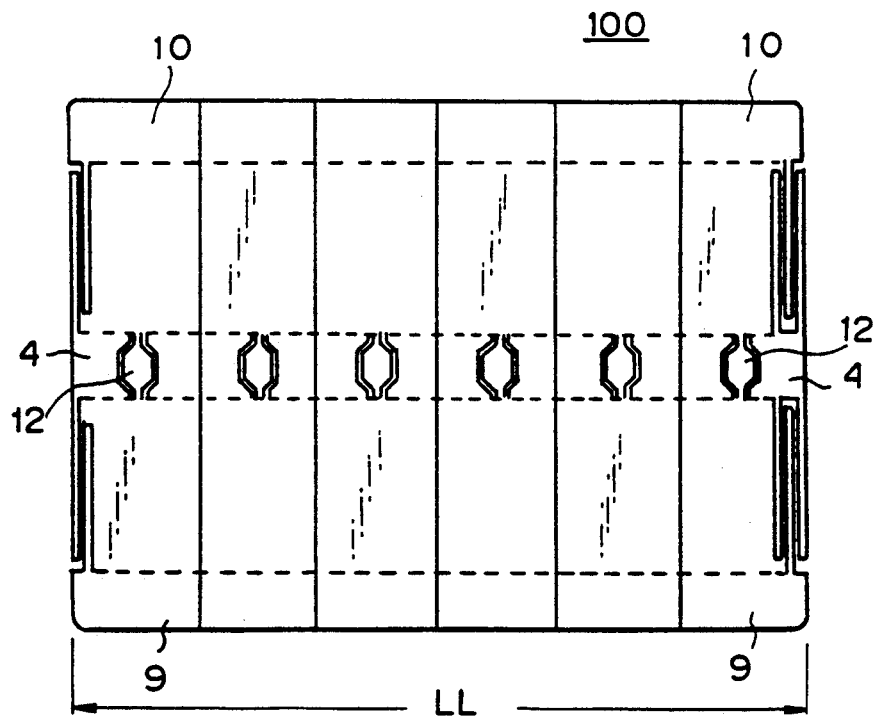
FIG. 7 is a plan view showing a second embodiment of a semiconductor device according to the present invention.

FIG. 7 shows a second embodiment of a semiconductor device according to the present invention.

As shown in FIG. 7, in the semiconductor device of the second embodiment, a plurality of the semiconductor devices shown in FIG. 4 are arranged in parallel; this corresponds to the device shown in FIG. 2 of the prior art.

By comparing the semiconductor device (semiconductor chip) shown in FIG. 7 with that shown in FIG. 2, when the total length of the gate widths (total gate with) of the semiconductor device of FIG. 7 is the same as that of FIG. 2, the length LL of the semiconductor device (semiconductor chip), or of the gate bus line of the semiconductor device of the present invention shown in FIG. 7, is one-half of that shown in FIG. 2. Therefore, the shape of the semiconductor device can be made a rectangle having one side (LL) not much larger than the other, i.e., the shape of the semiconductor device can be made approximately a square, and thus the semiconductor device is not easily broken during the scrub process and the like.

Namely, when the length LL of the semiconductor device of the semiconductor device of FIG. 7 is the same as that of FIG. 2, the total gate width of the semiconductor device of FIG. 7 can be made double that of FIG. 2. Further, when the length LL of the semiconductor device of the semiconductor device of FIG. 7 is the same as that of FIG. 2, and further, when the total gate widths thereof are made the same, a unit gate width WW of the semiconductor device shown in FIG. 7 can be made one-half of that shown in FIG. 2, and therefore, the high-frequency characteristics of the semiconductor device (transistor) are not deteriorated by an uneven phase rotation.

As described above, when a plurality of the semiconductor device (elements) of FIG. 4 are arranged as shown in FIG. 7, the length LL of the semiconductor device thereof can be shortened, or can be made one-half of the length of the conventional semiconductor device shown in FIG. 2, whereby the electric power is uniformly distributed and the influence of the phase rotation can be reduced. Therefore, according to the present embodiment, the output power, gain, etc., of a high-frequency high-output power transistor can be increased, i.e., high-frequency characteristics of the semiconductor device can be improved. Further, according to the present embodiment, the aspect ratio of the semiconductor chip (semiconductor device) can be reduced, and thus cracks in the semiconductor device can be avoided.

Figure 8:
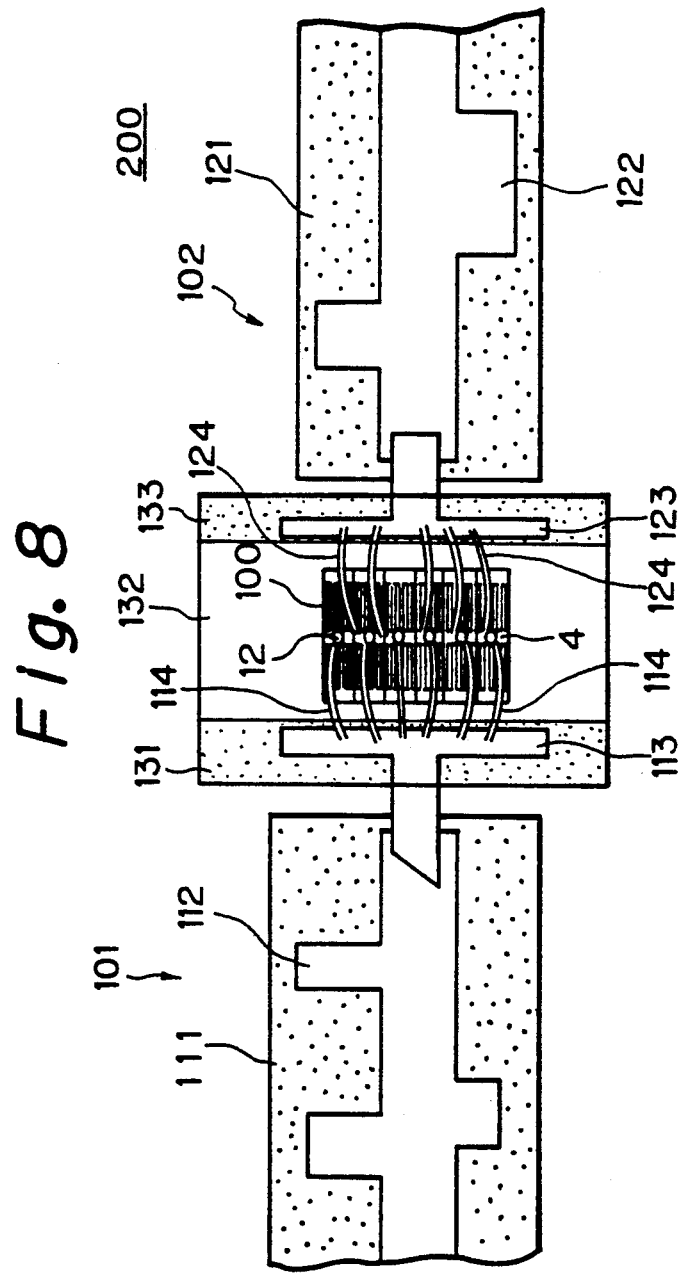
FIG. 8 is a plan view showing a part of a microwave amplifier using the second embodiment shown in FIG. 7.

FIG. 8 shows a part of a microwave amplifier using the second embodiment shown in FIG. 7.

In FIG. 8, reference numeral 200 denotes a microwave amplifier, 100 denotes a high-power compound semiconductor device (semiconductor chip) corresponding to that shown in FIG. 7, 101 denotes an input matching circuit for carrying out an impedance matching at an input side of the semiconductor device 100, and 102 denotes an output matching circuit for carrying out an impedance matching at an output side of the semiconductor device 100. Note, the microwave amplifier 200 having an output power of, for example, 4 watts or 8 watts, is used to amplify signals of the microwave band (1 GHz to 20 GHz) for transfer to a communication satellite.

As shown in FIG. 8, the semiconductor device 100 is positioned between the input matching circuit 101 and the output matching circuit 102, input side electrodes (gate electrodes) of the semiconductor device 100 are connected to an electrode 113 of the input matching circuit 101 by a plurality of bonding wires 114, and output side electrodes (drain electrodes) of the semiconductor device 100 are connected to an electrode 123 of the output matching circuit 102 by a plurality of bonding wires. Note, as shown in FIG. 8, the input matching circuit 101 comprises a substrate 111 made of aluminum oxide ($Al_2O_3$ alumina), a metallic pattern portion 112 and the electrode 113; similarly, the output matching circuit 102 comprises a substrate 121 made of aluminum oxide ($Al_2O_3$), a metallic pattern portion 122 and the electrode 123. Further, the semiconductor device 100 is formed on a metallic portion 132, and the electrodes 113 and 123 are formed on aluminum oxide portions 131 and 133.

When producing (assembling) the microwave amplifier 200, the semiconductor device 100 is disposed on the metallic portion 132 between the input matching circuit 101 and the output matching circuit 102 in a package (not shown), and then the semiconductor device 100 is fixed to the surface of the package by heating and melting gold-tin alloy, and by carrying out a scrub process. Note, the metallic pattern portions 112 and 122 are formed to carry out a fine control of the impedance matching at the input and output sides of the amplifier circuit 200.

In the above description, the high-power microwave semiconductor device 100 is formed so as to a very thin (for example, 30 $\mu$m or 100 $\mu$m),to effectively radiate the heat produced thereby, because the semiconductor device 100 consumes a large amount of power, and thus produces a large amount of heat. Note, the semiconductor device 100 used for a high-power microwave amplifier 200 (for example, made of Gallium Arsenide (GaAs)) is more delicate than that of silicon (Si), but the semiconductor device 100 can be formed as a square, and thus the semiconductor device 100 is not easily broken during the scrub process and the like.

Figure 9:
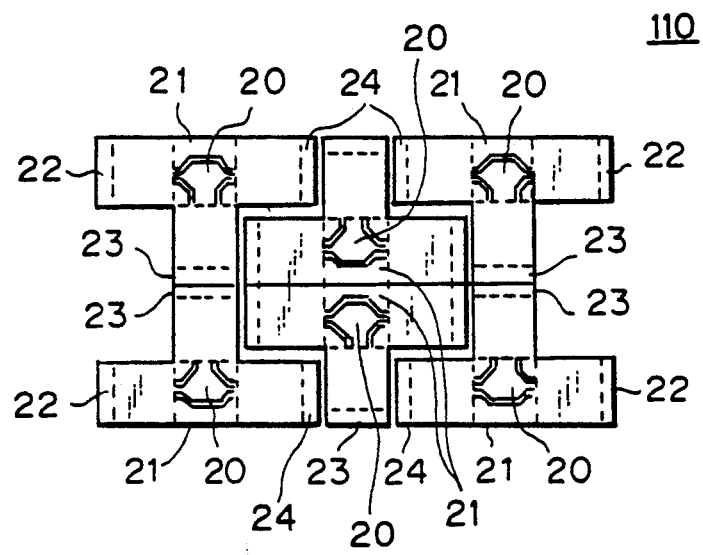
FIG. 9 is a plan view showing a third embodiment of a semiconductor device according to the present invention.
Figure 10:
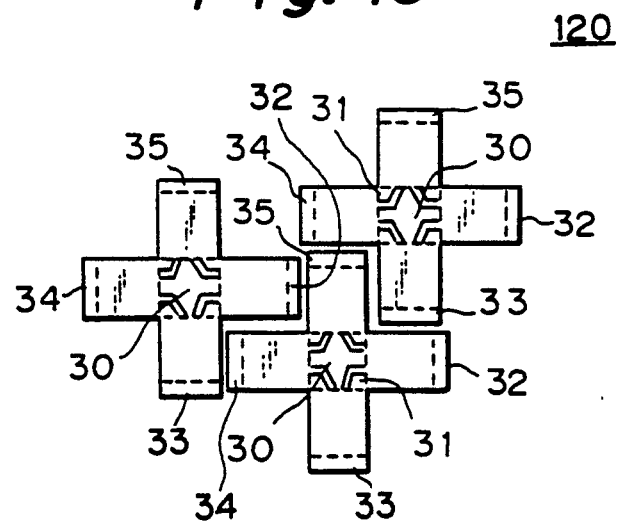
FIG. 10 is a plan view showing a fourth embodiment of a semiconductor device according to the present invention.

FIGS. 9 and 10 show third and fourth embodiments of a semiconductor device according to the present invention.

As shown in FIGS. 9 and 10, in the third and fourth embodiments of the semiconductor device of the present invention, the gate electrodes, source electrodes, and drain electrodes are axi-symmetrically arranged around the drain pad. Namely, as shown in FIG. 9, in the third embodiment it is possible to arrange the electrodes in three directions orthogonal to one another, and to lay out a plurality of these arrangements. In FIG. 9, reference numeral 20 denotes a gate pad, 21 a drain pad, and 22 to 24 are source pads. Further, as shown in FIG. 10, in the fourth embodiment, it is also possible to arrange the electrodes in four directions orthogonal to one another, and to lay out a plurality of these arrangements. In FIG. 10, reference numeral 30 denotes a gate pad, 31 a drain pad, and 32 to 25 are source pads.

Note, the semiconductor devices 110 and 120 shown in FIGS. 9 and 10 can be also applied to a microwave amplifier, the explanations of which are the same as given above with reference to FIG. 8.

Namely, in the third embodiment 110 of the semiconductor device shown in FIG. 9, the drain electrodes (5) extend in three directions from the drain pad 21. Note, three source pads (22, 23, 24) are provided in accordance with the three directions in which the drain electrodes are extended Similarly, in the fourth embodiment 120 of the semiconductor device shown in FIG. 10, the drain electrodes (5) extend in four directions from the drain pad 31. Note, four source pads (32, 33, 34, 35) are provided in accordance with the four directions in which the drain electrodes are extended.

Note, the semiconductor device of the third and fourth embodiments can be arranged to constitute a semiconductor chip having the shape of a square, whereby cracks in the semiconductor device can be avoided.

As described above, these embodiments prevent an output voltage drop due to a phase rotation, provide a higher output, further reduce an aspect ratio of the device, and suppress chip cracking. Note, although not shown in FIGS. 9 and 10, each of the pads shown in FIGS. 9 and 10 is connected to electrodes, similar to the arrangement shown in FIG. 4.

In the above description, the embodiments of the semiconductor device can use various types of transistors, such as MESFETs, MISFETs, HEMTs, and the like. Further, the present invention also can be applied for improving the characteristics of high power amplification vertical junction FETs formed on a silicon substrate, and of other high-output power transistors, by forming gate, source, and drain electrodes in two to four directions around a pad, as explained above.

As described above, according to the present invention, when a plurality of the semiconductor device are arranged, the length LL of the semiconductor device thereof can be shortened, so that electric power is uniformly distributed and the influence of a phase rotation can be reduced. Therefore, the output power, gain, etc., of a high-frequency high-output power transistor can be increased, i.e., the high-frequency characteristics of the semiconductor device can be improved. Further, according to the present invention, the aspect ratio of the semiconductor chip (semiconductor device) can be reduced, and thus cracks in the semiconductor device can be avoided.

Many widely differing embodiments of the present invention may be constructed without departing from the spirit and scope of the present invention, and it should be understood that the present invention is not limited to the specific embodiments described in this specification, except as defined in the appended claims.

We claim:

1. A semiconductor device having at least one transistor for amplifying signals and comprising:

a semiconductor layer;

a first pad of conductive material formed on said semiconductor layer;

a plurality of first groups of first electrodes in contact with said semiconductor layer and said first pad, each first group comprising plural first electrodes arranged in a comb-shape with corresponding spaces between the adjacent first electrodes, the plurality of first groups of first electrodes being electrically connected to and extending from said first pad in a plurality of respective and different first directions and each first electrode having a free end remote from the first pad;

a plurality of second gas pads of conductive material respectively corresponding to the plurality of first groups of first electrodes and formed on said semiconductor layer adjacent to the free ends of said first electrodes of said respectively corresponding first groups thereof;

a plurality of second groups of second electrodes in contact with said semiconductor layer and respectively associated with said plurality of second pads and the respectively corresponding plurality of first groups of first electrodes, each second group comprising plural second electrodes arranged in a comb-shape with corresponding spaces between the adjacent second electrodes, each second group of second electrodes being electrically connected to and extending from the respectively associated second pad in a second direction, opposite to the first direction of the plural first electrodes of the respectively associated first group, the respective first and second electrodes of respectively associated first and second groups being disposed in alternating relationship with the electrodes of one group disposed on the corresponding spaces between the adjacent electrodes of the other, respectively associated group;

a third pad of conductive material formed on said semiconductor layer within an inner region of said first pad and electrically isolated from said first pad; and a plurality of third groups of third electrodes formed on said semiconductor layer and respectively corresponding to the respectively associated first and second pluralities of first and second groups of first and second electrodes, each third group comprising plural third electrodes connected so said third pad and extending in the first direction of the respectively associated first group of first electrodes, the third electrodes of each third group being disposed within the space between respective, adjacent first and second electrodes of the corresponding and respectively associated first and second groups thereof.

2. A semiconductor device as claimed in claim 1, wherein said first electrodes are arranged in two first groups which extend in two, respective and opposite first directions from said first pad, and said plurality of second pads comprises two second pads.

3. A semiconductor device as claimed in claim 1, wherein said first electrodes are arranged in three first groups which extend in three, respective and different directions from said first pad, and said plurality of second pads comprises three second pads.

4. A semiconductor device as claimed in claim 1, wherein said first electrodes are arranged in four first groups which extend in four, respective and different directions from said first pad, and said plurality of second pads comprises four second pads.

5. A semiconductor device as claimed in claim 1, further comprising a plurality of said transistors for amplifying signals, and wherein said plurality of first groups of respective, plural first electrodes are drain electrodes, said plurality of second groups of respective, second electrodes are source electrodes, and said plurality of third groups or respective plural third electrodes are gate electrodes, respectively, of said plurality of transistors.

6. A semiconductor device as claimed in claim 1, wherein said semiconductor device amplifies signals of the microwave band.

7. A microwave amplifier including a semiconductor device having at least one transistor for amplifying signals, an input matching circuit, connected to said semiconductor device, for carrying out impedance matching at an input side of said semiconductor device; and an output matching circuit, connected to said semiconductor device, for carrying out impedance matching at an output side of said semiconductor device, wherein said semiconductor device comprises:

a semiconductor layer;

a first pad of conductive material formed on said semiconductor layer;

a plurality of first groups of first electrodes in contact with said semiconductor layer and said first pad, each first group comprising plural first electrodes arranged in a comb-shape with corresponding spaces between the adjacent first electrodes, the plurality of first groups of first electrodes being electrically connected to and extending from said first pad in a plurality of respective and different first directions and each first electrode having a free end remote from the first pad;

a plurality of second pads of conductive material respectively corresponding to the plurality of first groups of first electrodes and formed on said semiconductor layer adjacent to the free ends of said first electrodes of said respectively corresponding first groups thereof;

a plurality of second groups of second electrodes in contact with said semiconductor layer and respectively associated with said plurality of second pads and the respectively corresponding plurality of first groups of first electrodes, in each second group comprising plural second electrodes arranged in a comb-shape with corresponding spaces between the adjacent second electrodes, each second group of second electrodes being electrically connected to and extending from the respectively associated second pad in a second direction, opposite to the first direction of the plural first electrodes of the respectively associated first group, the respective first and second electrodes of respectively associated first and second groups being disposed in alternating relationship with the electrodes of one group disposed on the corresponding spaces between the adjacent electrodes of the other, respectively associated group;

a third pad of conductive material formed on said semiconductor layer within an inner region of said first pad and electrically isolated from said first pad; and a plurality of third groups of third electrodes formed on said semiconductor layer and respectively corresponding to the respectively associated first and second pluralities of first and second groups of first and second electrodes, each third group comprising plural third electrodes connected to said third pad and extending in the first direction of the respectively associated first group of first electrodes, the third electrodes of each third group being disposed within the space between respective, adjacent first and second electrodes of the corresponding and respectively associated first and second groups thereof.

8. A microwave amplifier as claimed in claim 7, wherein said first electrodes are arranged in two first groups which extend in two, respective and opposite directions from said first pad, and said plurality of second pads comprises two second pads.

9. A microwave amplifier as claimed in claim 7, wherein said first electrodes are arranged in these first groups which extend in three, respective and different directions from said first pad, and said plurality of second pads comprises three second pads.

10. A microwave amplifier as claimed in claim 7, wherein said first electrodes are arranged in four first groups which extend in four, respective and different directions rom said first pad, and said plurality of second pads comprises four second pads.

11. A microwave amplifier as claimed in claim 7, further comprising a plurality of said transistors for amplifying signals, and wherein said plurality of first groups of respective, plural first electrodes are drain electrodes, said plurality of second groups of respective, second electrodes are source electrodes, and said plurality of third groups of respective, plural third electrodes are gate electrodes, respectively, of said plurality of transistors.

12. A microwave amplifier as claimed in claim 7, wherein said semiconductor device amplifies signals of the microwave band.

* * * * *

UNITED STATES PATENT AND TRADEMARK OFFICE
CERTIFICATE OF CORRECTION

PATENT NO. : 5,287,072
DATED : February 15, 1994
INVENTOR(S) : KOJIMA et al.

It is certified that error appears in the above-indentified patent and that said Letters Patent is hereby corrected as shown below:

Col. 1,     line 17, after "rapidly" delete ",".
            line 21, after "cordingly" insert --,--.

Col. 2,     line 14, after "and" delete ",".

Col. 3,     line 66, after "art" change "," to --;--.

Col. 4,     lines 41-42, begin a new paragraph with "Therefore,".

Col. 5,     line 13, after "drain" delete ",";
            line 44, change "one half" to --one-half--.

Col. 6,     line 60, begin a new paragraph with "Further,".

Col. 7,     line 64, change ", to" to --thereby to--.

Col. 9,     line 63, change "so" to --to--.

UNITED STATES PATENT AND TRADEMARK OFFICE
CERTIFICATE OF CORRECTION

PATENT NO. : 5,287,072
DATED : February 15, 1994
INVENTOR(S) : KOJIMA et al.

It is certified that error appears in the above-indentified patent and that said Letters Patent is hereby corrected as shown below:

Col. 10, line 24, after "respective" insert --,--;
 line 62, delete "in".

Col. 12, line 12, change "rom" to --from--.

Signed and Sealed this

Eleventh Day of October, 1994

Attest:

BRUCE LEHMAN

Attesting Officer    Commissioner of Patents and Trademarks